(12) United States Patent
Yang et al.

(10) Patent No.: US 7,700,417 B2
(45) Date of Patent: Apr. 20, 2010

(54) METHODS FOR FORMING CASCODE CURRENT MIRRORS

(75) Inventors: Hongning Yang, Chandler, AZ (US); Geoffrey W. Perkins, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 546 days.

(21) Appl. No.: 11/686,439

(22) Filed: Mar. 15, 2007

(65) Prior Publication Data

US 2008/0224221 A1  Sep. 18, 2008

(51) Int. Cl.
*H01L 21/00* (2006.01)

(52) U.S. Cl. .................. 438/149; 438/154; 438/292; 438/301; 438/510; 438/514; 438/981; 257/E21.533; 257/E21.675

(58) Field of Classification Search .................. 438/149, 438/154, 292, 301, 510, 514, 981, FOR. 490; 257/E21.533, E21.675
See application file for complete search history.

(56) References Cited

U.S. PATENT DOCUMENTS 6,211,659 B1   4/2001   Singh 6,924,693 B1 *  8/2005   Black .................. 327/543

* cited by examiner

*Primary Examiner*—Thanh V Pham
(74) *Attorney, Agent, or Firm*—Ingrassia, Fisher & Lorenz, P.C.

(57) ABSTRACT

A cascode amplifier (CA) (60) is described having a bottom transistor ($T1_{new}$) with a relatively thin gate dielectric (67) and higher ratio (RB) of channel length ($Lch1_{new}$) to width ($W1_{new}$) and a series coupled top transistor ($T2_{new}$) with a relatively thick gate dielectric (68) and a lower ratio (RT) of channel length ($Lch2_{new}$) to width ($W2_{new}$). An improved cascode current mirror (CCM) (74) is formed using a coupled pair of CAs (60, 60'), one (60) forming the reference current (RC) side (601) and the other (60') forming the mirror current side (602) of the CCM (74). The gates (65, 65') of the bottom transistors ($T1_{new}$, $T3_{new}$) are tied together and to the common node (21) between the series coupled bottom ($T1_{new}$) and top ($T2_{new}$) transistors of the RC side (601), and the gates (66', 66') of the top transistors ($T2_{new}$, $T4_{new}$) are coupled together and to the top drain node (64) of the RC side (601). The area of the CCM (74) can be substantially shrunk without adverse affect on the matching, noise performance and maximum allowable operating voltage.

20 Claims, 5 Drawing Sheets

US 7,700,417 B2

METHODS FOR FORMING CASCODE CURRENT MIRRORS

FIELD OF THE INVENTION

The present invention generally relates to semiconductor devices and methods for fabricating semiconductor devices, and more particularly relates to cascode current mirrors and methods therefore.

BACKGROUND OF THE INVENTION

Processing technologies and device structures for forming integrated circuits (ICs) are often implemented by using a plurality of interconnected field effect transistors (FETs), also called metal-oxide-semiconductor field effect transistors (MOSFETs), or simply MOS transistors or devices. Although the term "MOS" properly refers to a device having a metal gate electrode and an oxide gate insulator, that term will be used throughout to refer to any semiconductor device that includes a conductive gate electrode (whether metal or not) that is positioned over a gate insulator (whether oxide or other dielectric material) which, in turn, is positioned over a semiconductor surface. Accordingly, the terms metal-oxide-semiconductor and the abbreviations "MOS" and "MOSFET" are used herein even though such devices may not employ just metals or oxides but combinations of conductive materials, e.g., alloys, silicides, doped semiconductors, etc., instead of simple metals, and insulating materials other than silicon oxides (e.g., nitrides, oxy-nitrides, other oxides mixtures of dielectric materials, etc.). Thus, as used hereon the terms MOS and MOSFET are intended to include such variations.

A typical MOS transistor includes a gate as a control electrode and spaced-apart source and drain regions between which a current can flow. A control voltage applied to the gate adjusts the flow of current through a controllable conductive channel between the source and drain. It is well known in the art that a pair of two identical MOSFETs can form a simple current mirror with 1:1 ratio. A current mirror is a device in which a reference current (I-ref.) flowing through one MOSFET is replicated in the parallel MOSFET. The replicated current, also called the mirror current (I-mir.), is then used to supply a precisely determined current to other parts of the circuit without impact on the reference current itself. Similarly, it is well known in the art to series connect two MOSFETs to form a "Cascode" amplifier. A pair of such cascode amplifiers can be connected to form a cascode current minor. Compared to a simple two transistor current mirror, a cascode mirror can reduce the error that can arise due to the finite output impedance of the MOSFETs and provide more precise mirror current. Cascode current mirrors are widely used in high precision analog circuits. For convenience of description and not intended to be limiting, n-channel (NMOS) cascode mirrors are illustrated herein, but persons of skill in the art will understand that the present invention is not limited merely to n-channel mirrors and that p-channel (PMOS) and other types of devices may be provided by substitution of semiconductor regions of opposite conductivity type.

FIG. 1 shows a simplified schematic circuit diagram of current mirror cascode 20. Reference current (left) side cascode 22 comprises lower or bottom transistor T1 series coupled to upper or top transistor T2. For an NMOS cascode, reference current I-ref. flows from terminal 23 through T2 and T1 to terminal 24 while for a PMOS cascode, the current direction is opposite. Gate 25 of transistor T1 is coupled to node 27 which is in turn coupled to node 21 located between T1 and T2. Gate 26 of transistor T2 is coupled to node 28 which is in turn coupled to node 29 between transistor T2 and terminal 23. In other words, for each transistor (T1 or T2), its gate (25 or 26) is tied to its drain (21 or 29), respectively.

Mirror current (right) side cascode 32 comprises lower or bottom transistor T3 series coupled to upper or top transistor T4. For an NMOS cascode, mirror current I-mir flows from terminal 33 through T4 and T3 to terminal 34. Gate 35 of transistor T3 is coupled to node 27 which is in turn coupled to node 21 located between T1 and T2. Gate 36 of transistor T2 is coupled to node 28 which is in turn coupled to node 29 between transistor T2 and terminal 23. Gates 25 and 35 are coupled together and gates 26 and 36 are coupled together. It is common in the art to refer to Transistors T2, T4 as the "upper transistors" or "top" of cascode mirror 20 and transistors T1, T3 as the "lower transistors" or "bottom" of cascode mirror 20. The words "upper" and "top" are used interchangeably herein as are the words "lower" and "bottom". Vg1 refers to the gate voltage on gates 25, 35 (collectively first gates G1) of bottom transistors T1, T3 and Vg2 refers to the voltage on gates 26, 36 (collectively second gates G2) of top transistors T2, T4. Nodes 24 and 34 are generally connected to the same reference voltage (for NMOS, for example, Vref=0). Both Vg1 and Vg2 are determined by reference current I-ref. Often, the voltage bias on node 33 is different from that on node 23 (or Vg2) and use of the cascode structure can correct the error induced by such bias difference.

FIG. 2 shows a simplified schematic cross-sectional view through NMOS cascode amplifier 40 suitable for use in a cascode current mirror, according to the prior art. FIG. 3 shows a simplified schematic plan view of two prior art cascode amplifiers of the type illustrated in FIG. 2, arranged to form cascode current mirror 72 implementing circuit 20 of FIG. 1. Other than the interconnections used to form the current mirror, the cascode amplifiers in FIG. 3 are assumed to be substantially identical. The same reference numbers are used in FIGS. 2 and 3 to identify like regions, with primes (') added to indicate those regions of the second cascode amplifier needed to form the current mirror. For convenience of explanation, various construction details have been omitted in FIGS. 2 and 3. For example, the interconnection layers needed to interconnect various regions of amplifiers 40, 40' in FIG. 3 have been omitted to avoid obscuring underlying device regions, and these interconnections are shown schematically. For convenience of explanation, the prior art and the invention are described for the case of N-channel devices, but this is not intended to be limiting and persons of skill in the art will understand based on the description herein that P-channel devices can be constructed by replacing N-type regions with P-type regions and vice versa. Single cascode amplifier 40 is illustrated in FIG. 2 and two cascode amplifiers 40, 40' of the type shown in FIG. 2 are illustrated in FIG. 3, interconnected to form cascode current mirror 72 implementing circuit 20 of FIG. 1. FIGS. 2 and 3 should be considered together. To facilitate relating the transistors (T1, T2, T3, T4) of FIG. 1 to those of FIGS. 2-3, the same identifying labels (e.g., T1, T2, T3, T4) are used but with the suffix "old" added to specifically denote the transistors of FIGS. 2-3, that is, T1$_{old}$, T2$_{old}$, T3$_{old}$, T4$_{old}$. The same convention is followed for other identifying labels, e.g., G1$_{old}$, G2$_{old}$.

Cascode amplifier 40 comprises P-type substrate or region 41 (often a doped "well"), N+ region 42 that acts as a source (S) region for lower transistor T1$_{old}$, N+ region 43 that serves simultaneously as a drain (D) region for lower transistor T1$_{old}$ and a source (S) region for upper transistor T2$_{old}$ (collectively D/S region 43), and N+ region 44 that serves as the drain (D) region for upper transistor T2$_{old}$. First gate (G1$_{old}$) 45 overlies gate dielectric 47 of thickness 471 above channel region 49 between source (S) region 42 and D/S region 43, and second gate (G2$_{old}$) overlies gate dielectric 48 of thickness 481 above channel region 50 between D/S region 43 and drain (D) region 44. When cascode amplifier 40 is appropriately biased, source-drain electron current Isd$_{old}$ (in an N-channel device) flows through channels 49, 50. In FIG. 3 implementing current mirror 20, cascode amplifier 40 is assumed to form reference side 401 and substantially identical cascode amplifier 40' is assumed to form mirror side 402. When arranged as in circuit 20 of FIG. 1, source 42 of transistor T1$_{old}$ of cascode amplifier 40 is coupled to terminal 24 and drain 44 of transistor T2$_{old}$ is coupled to terminal 23. Similarly, source 42' of transistor T3$_{old}$ of cascode amplifier 40' is coupled to terminal 34 and drain 44' of transistor T4$_{old}$ is coupled to terminal 33. Gates 45 and 45' of transistors T1$_{old}$, T3$_{old}$ are coupled together at node 27 and to D/S region 43 of reference side cascode amplifier 40 at node 21. Similarly, gates 46 and 46' of transistors T2$_{old}$, T4$_{old}$ are coupled together at node 28 and to drain region 44 of reference side cascode amplifier 40 at node 29. In conventional cascode current mirror 72, gates 45, 45' and 46, 46' of transistors T1$_{old}$, T3$_{old}$ and T2$_{old}$, T4$_{old}$ have substantially equal gate areas and substantially equal gate dielectric thicknesses 471, 481, 471', 481', where the unprimed and primed (') reference numbers refer to the various elements of cascode amplifiers 40, 40' used for reference current side 401 and mirror current side 402 of current mirror 72, respectively. Further, the ratios R=L/W of channel length L to channel width W of the top and bottom devices in the prior art are generally substantially the same.

There is a great need in forming advanced precision analog integrated circuits to shrink the chip area occupied by such cascode current mirrors to smaller and smaller dimensions. However, as the devices making up the cascode mirror are reduced in size, the matching between the devices that make up reference and current mirror sides 401, 402 deteriorates and the noise performance worsens. This arises because the inevitable manufacturing variations become a larger fraction of the device dimensions as the device dimensions are shrunk and, therefore, have a proportionately greater affect on the device properties, especially device matching. A further problem is that there is an ongoing trend to reduce supply voltages. This means that the voltage available to provide gate overdrive voltage is also decreasing. The gate overdrive voltage (Vod) is the amount by which the available gate drive voltage (Vg) exceeds the device threshold voltage (Vth), that is, Vod=Vg−Vth. For the same threshold voltage Vth, if the available supply voltage Vsupp is reduced, the available overdrive voltage Vod is also reduced and the worse the mismatch and noise problems become. Thus, as supply voltages are reduced, mismatch and noise problems become more severe. While the increased mismatch and noise associated with lower operating voltages can be avoided or mitigated by increasing the gate area, this is not an economically viable solution for advanced smaller area circuits.

Accordingly, there is an ongoing need and desire to provide improved cascode current mirror devices and methods adapted to operate at lower supply voltages without increasing the mismatch. In addition, it is desirable to provide a structure and method for fabricating cascode current mirrors that are shrinkable to smaller dimensions without sacrificing performance or increasing mismatch. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
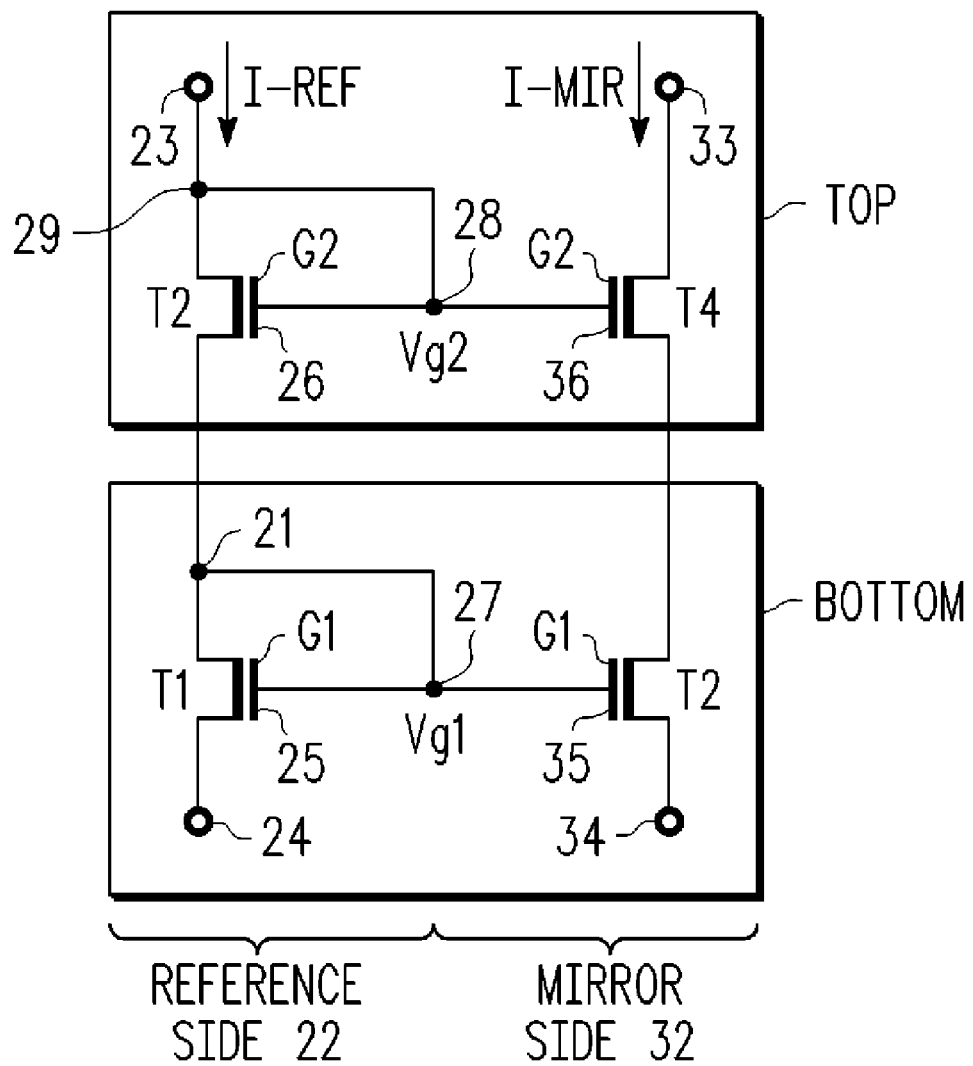
FIG. 1 shows a simplified schematic circuit diagram of a current mirror cascode.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Further, when comparing common MOSFET parameters such as channel length L and channel width W, the suffix "old" is attached when referring to the prior art devices of FIGS. 2-3 and the suffix "new" is attached when referring to the invented embodiments of, for example, FIGS. 4-5.

Figure 4:
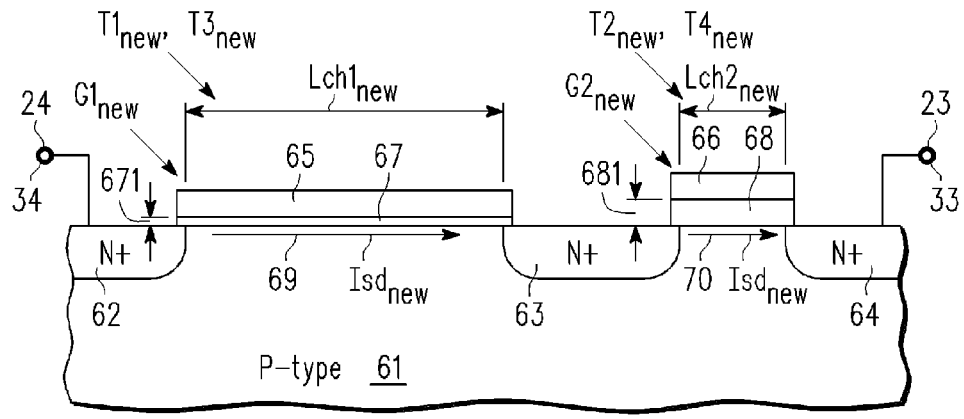
FIG. 4 is a simplified schematic cross-sectional view through a cascode amplifier suitable for use in a cascode current mirror, according to an embodiment of the invention.
Figure 5:
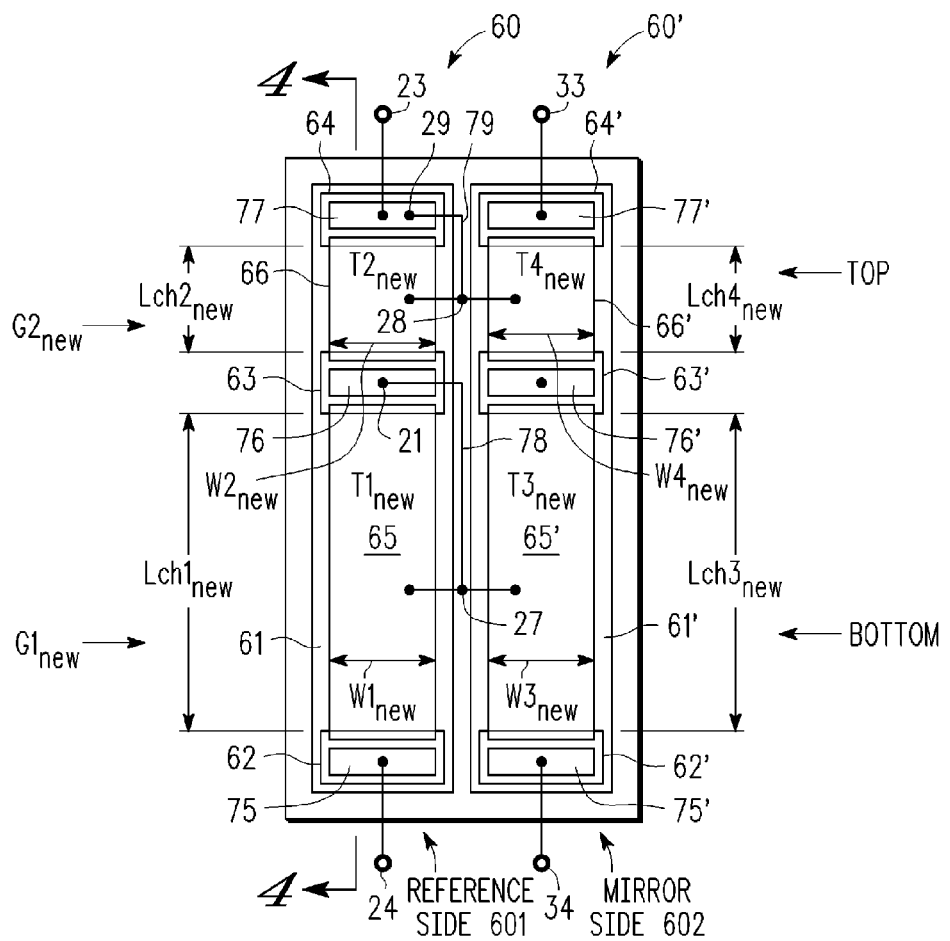
FIG. 5 is a simplified schematic plan view of a cascode current mirror of the type illustrated in FIG. 1, using the cascode amplifiers illustrated in FIG. 4, according to another embodiment of the invention.

FIG. 4 shows a simplified schematic cross-sectional view through cascode amplifier 60 suitable for use in implementing cascode current mirror circuit 20 of FIG. 1, according to an embodiment of the invention. FIG. 5 shows a simplified schematic plan view of two cascode amplifiers 60, 60' of the type illustrated in FIG. 4 arranged to form cascode current mirror 74 implementing circuit 20 of FIG. 1. For convenience of description and not intended to be limiting, a current mirror with current ratio (I-ref):(I-mir)=1:1 is illustrated. However, persons of skill in the art will understand that the present invention is not limited merely to 1:1 current ratios and that current ratios (I-ref):(I-mir)=1:N may be achieved by, for example, providing N parallel cascode amplifiers 60'. Other than the interconnections used to form the current mirror, the cascode amplifiers 60, 60' in FIG. 5 are assumed to be substantially identical. The same reference numbers are used in FIGS. 4 and 5 to identify like regions, with primes (') added to indicate those regions of the second cascode amplifier 60' needed to form current mirror circuit 20. Cascode amplifier 60 forms reference current side 601 of current mirror 74 and substantially identical cascode amplifier 60' forms mirror current side 602 of cascode current mirror 74 of FIG. 5. For convenience of explanation, various construction details have been omitted in FIGS. 4 and 5. For example, the conductive layers needed to interconnect various regions of amplifiers 60, 60' in FIG. 5 have been omitted to avoid obscuring underlying device regions, and these interconnections are shown schematically. For convenience of explanation, the invention is described for the case of N-channel devices, but this is not intended to be limiting and persons of skill in the art will understand based on the description herein that P-channel devices can be constructed by replacing N-type regions with P-type regions and vice versa.

Single cascode amplifier 60 is illustrated in FIG. 4 and two cascode amplifiers 60, 60' of the type shown in FIG. 4 are illustrated in FIG. 5, interconnected to form cascode current mirror 74 implementing circuit 20 of FIG. 1. FIGS. 4 and 5 should be considered together. Cascode amplifier 60 comprises P-type substrate or region 61 (often a doped "well"), N+ region 62 that acts as a source (S) region for lower transistor $T1_{new}$, N+ region 63 that serves simultaneously as a drain (D) region for lower transistor $T1_{new}$ and a source (S) region for upper transistor $T2_{new}$ (collectively D/S region 63), and N+ region 64 that serves as the drain (D) region for upper transistor $T2_{new}$. First gate ($G1_{new}$) 65 overlies gate dielectric 67 of thickness 671 above channel region 69 between source (S) region 62 and D/S region 63, and second gate ($G2_{new}$) overlies gate dielectric 68 of thickness 681 above channel region 70 between D/S region 63 and drain (D) region 64. When cascode amplifier 60 is appropriately connected to a current source that provides the reference current, source-drain electron current $Isd_{new}$ (in an N-channel device) flows through channels 69, 70. In FIG. 5 implementing cascode current mirror 74, cascode amplifier 60 is assumed to form reference side 601 and substantially identical cascode amplifier 60' is assumed to form mirror side 602. When arranged as in circuit 20 of FIG. 1, source 62 of transistor $T1_{new}$ of cascode amplifier 60 is coupled to terminal 24 and drain 64 of transistor $T2_{new}$ is coupled to terminal 23. Similarly, source 62' of transistor $T3_{new}$ of cascode amplifier 60' is coupled to terminal 34 and drain 64' of transistor $T4_{new}$ is coupled to terminal 33. Gates 65 and 65' of transistors $T1_{new}$, $T3_{new}$ are coupled together at node 27 and to D/S region 63 of reference side cascode amplifier 60 at node 21. Similarly, gates 66 and 66' of transistors $T2_{new}$, $T4_{new}$ are coupled together at node 28 and to drain region 64 of reference side cascode amplifier 60 at node 29.

Figure 2:
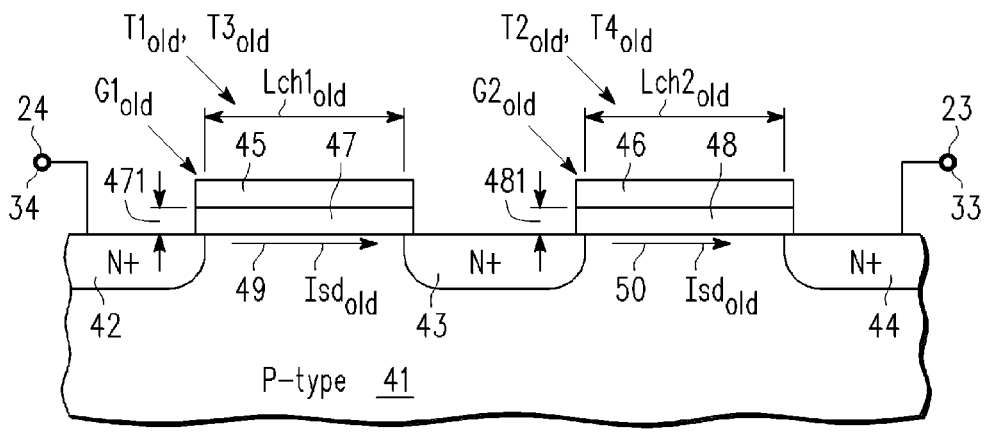
FIG. 2 is a simplified schematic cross-sectional view through a cascode amplifier suitable for use in a cascode current mirror, according to the prior art.
Figure 3:
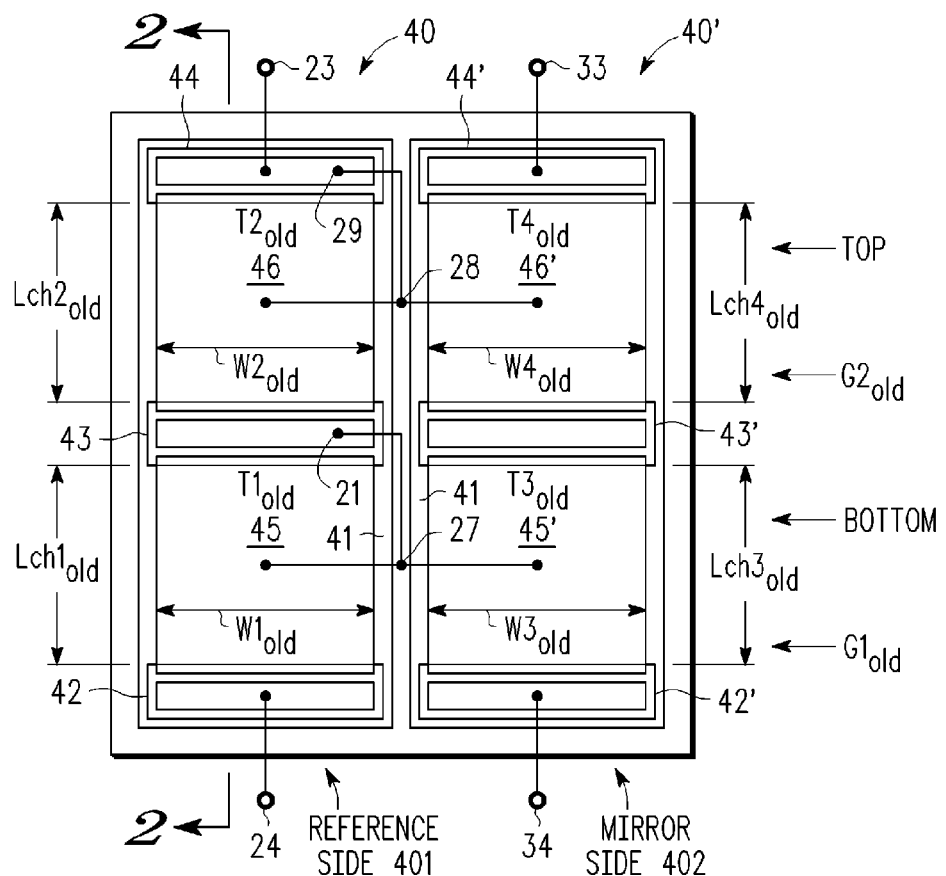
FIG. 3 is a simplified schematic plan view of a cascode current mirror of the type illustrated in FIG. 1, using the cascode amplifiers illustrated in FIG. 2, according to the prior art.

Cascode amplifiers 60, 60' and cascode current mirror 74 illustrated in FIGS. 4-5, differ from their prior art counterparts 40, 40' and 72 of FIGS. 2-3 in several respects, one or more of which is included in the various embodiments of the invention:

First, gate dielectric thickness 671 under first gate $G1_{new}$ 65 is significantly smaller than gate dielectric thickness 681 under second gate $G2_{new}$ 66 of cascode amplifiers 60, 60' of cascode mirror 74. Whereas, in prior art current mirror 72, dielectric thicknesses 471, 481 under first gate $G1_{old}$ 45 and second gate $G2_{old}$ 46, respectively, are substantially equal.

Second, the ratio $RB_{new}=LchB_{new}/WB_{new}$ of channel length $Lch_{new}$ to channel width $WB_{new}$, where "B" refers to bottom transistors $T1_{new}$ and/or $T3_{new}$ of current mirror 74 is significantly larger than the ratio $RT_{new}=LchT_{new}/WT_{new}$, where "T" refers to top transistors $T2_{new}$ and/or $T4_{new}$ of current mirror 74. Whereas, in prior art current mirror 72, the corresponding rations $RB_{old}=LchB_{old}/WB_{old}$ and $RT_{old}=LchT_{old}/WT_{old}$ are substantially equal to 1, where "B" in this relation refers to bottom transistors $T1_{old}$, $T3_{old}$ and "T" refers to top transistors $T2_{old}$, $T4_{old}$.

Third, the area of gates $G1_{new}$ and $G2_{new}$ of the bottom and top transistors of cascode amplifiers 60, 60' of cascode current mirror 74 are unequal. Whereas, in prior art device 40, 40' of cascode current mirror 72, the areas of gates $G1_{old}$ and $G2_{old}$ are substantially equal.

While the above-noted criteria are explained for the devices of cascode amplifiers 40, 60, they also apply to cascode amplifiers 40', 60'. By using unequal gate dielectric thicknesses and large unequal L to W ratios RB of the bottom transistors compared to RT of the top transistors, the channel widths $W1_{new}$, $W2_{new}$, $W3_{new}$, $W4_{new}$ (collectively W) of amplifier 60 and their primed counterparts of amplifier 60' can be made smaller than in the prior art devices and without sacrifice of other device properties (e.g., matching, noise performance, etc.), resulting in substantial area savings compared to the prior art. The invented device arrangement is especially well suited for use with lower supply voltages Vsupp.

In general, the ratio $RB_{new}$ should be as high as possible, taking into consideration the head room given by supply voltage Vsupp. Further, $W1_{new}$ and $W2_{new}$ should be as small as possible, taking into consideration the amount of current that needs to be provided by current mirror 74. Stated another way, it is desirable that the channel length to width ratio $RB_{new}$=LchB/WB, where B refers to bottom transistors $T1_{new}$ and/or $T3_{new}$, be in the range of about $1.5 \leq RB_{new} \leq 20$, and more conveniently in the range of about $2 \leq RB_{new} \leq 10$, and preferable in the range of about $2 \leq RB_{new} \leq 4$. Further, it is desirable that the channel length to width ratio $RT_{new}$=LchT/WT, where T refers to top transistors $T2_{new}$ and/or $T4_{new}$ be smaller than $RB_{new}$ and usefully in the range of about $0.2 \leq RT_{new} \leq 1$, more conveniently in the range of about $0.4 \leq RT_{new} \leq 1$, and preferable in the range of about $0.5 \leq RT_{new} \leq 1$. In addition, it is desirable that the relative gate dielectric thicknesses 671 and/or 671' of bottom transistors $T1_{new}$ and/or $T3_{new}$ should be about 10 to 90 percent of thickness 681 and/or 681' of top transistors $T2_{new}$ and/or $T4_{new}$, respectively, more conveniently about 20 to 50 percent and preferably about 30 to 40 percent. By way of example and not intended to be limiting, top transistors $T2_{new}$ and/or $T4_{new}$ can have gate dielectric (i.e., silicon dioxide equivalent) thicknesses usefully in the range of about 5 to 90 nano-meters, more conveniently in the range of about 5 to 30 nano-meters, and preferably of about 6 to 25 nano-meters. By way of example and not intended to be limiting, bottom transistor $T1_{new}$ and/or $T3_{new}$ new can have gate dielectric (i.e., silicon dioxide equivalent) thicknesses usefully in the range of about 0.5 to 5 nano-meters, more conveniently in the range of about 1 to 4 nano-meters, and preferably of about 2 to 3 nano-meters. In general, for 1:1 ratio current mirrors, it is desirable that bottom transistors $T1_{new}$ and $T3_{new}$ of the left and right cascode amplifiers have the same dielectric thickness, gate area and ratio $RB_{new}$, and that top transistors $T2_{new}$ and $T4_{new}$ of the left and right cascode amplifiers have the same dielectric thickness, gate area and ratio $RT_{new}$.

A comparison of cascode current mirrors 72 and 74 is provided in Table I below. The first two data rows provide results for the prior art device of FIGS. 2 and 3. The third and fourth data row provides results for embodiments of the invention illustrated in FIGS. 4 and 5. The first column identifies the type of devices used in the top and bottom of the cascode amplifiers and the cascode current mirror in terms of whether the gate oxide was "thick" or "thin". The second column gives the width W of the channels of these devices. The third column gives the channel length Lch for each of the four devices in the cascode current mirror. The fourth column gives the L to W ratios for the bottom MOSFETs. The fifth column gives the mismatch, i.e., the standard deviation of the difference between the mirror current and the reference current divided by the reference current, in percent. The sixth column gives the gate-source operating voltage (Vgs) in volts, and the last column gives the relative area shrink of the two implementations, where the prior art device is assumed to have a normalized area of 100% and the gate area of the invented device regions is expressed as a percentage of the area of the prior art device regions. In both the prior art and invented devices, the mirror current output I-mir was about five micro-amps.

TABLE I

COMPARISON OF 5 MICRO-AMP UNITY CASCODE CURRENT MIRRORS

| MOSFET TYPE | W (μm) | L (μm) | L:W Ratio (bottom) | Id mis-match % | Gate Bias (V) | Relative Gate Area |
|---|---|---|---|---|---|---|
| Thick Top (old) | 4.8 | 4.8 | | | 2.196 | 100% |
| Thick Bottom (old) | 4.8 | 4.8 | 1:1 | 1.25 | 0.9391 Vg1 | 100% |
| Thick Top (new) | 1.2 | 1.2 | | | 1.827 | 6% |
| Thin Bottom (new) | 1.2 | 3.6 | 3:1 | 0.95 | 0.608 Vg1 | 19% |

The properties of conventional cascode current mirror 72 illustrated in FIGS. 2-3 using equal gate dielectric thicknesses, equal gate areas and equal L to W ratios are shown in the first two rows of data. The properties of cascode current mirror 74 corresponding to the embodiment of the invention illustrated in FIGS. 4-5 for cascode amplifiers 60, 60' with unequal gate dielectric thicknesses, unequal gate areas, and unequal L to W ratios for bottom transistors $T1_{new}$, $T3_{new}$, are illustrated in the lowest two rows of data. As can be seen, invented cascode current mirror 74 has a smaller mismatch (0.95% versus 1.25%) and at the same time a lower operating voltage capability (1.827 volts versus 2.196 volts) and a much smaller layout footprint. For example, the relative gate area of upper or top transistors $T2_{new}$, $T4_{new}$ in invented current mirror 74 is only about 6.3 percent of the area of conventional top transistors $T2_{old}$, $T4_{old}$ in current mirror 72. Similarly, the relative gate area of lower or bottom transistors $T1_{new}$, $T3_{new}$ new in invented embodiment of current mirror 74 is only about 19% of the area of lower or bottom transistors $T1_{old}$, $T3_{old}$ in conventional current mirror 72. Combining the areas of these several transistors, the overall gate area for invented current mirror 74 is about 12.5% of the gate area of conventional current mirror 72, while the other properties (e.g., mismatch, operating voltage, mirror current, etc.) are preserved or improved. As persons of skill in the art will understand, the overall shrink in total cascode current mirror area is less than the shrink in gate area because of the interconnection and isolation overhead, but the total area of current mirror 74 is still only about 40% of that of current mirror 72, with the same or better electrical properties and substantially the same mirror current (e.g., 5 micro-amps). Since manufacturing cost is generally proportional to the chip area occupied by the circuit, a 60% reduction in the area occupied by the improved cascode current mirror of the above-described embodiments of the invention, with no loss of performance, is a very significant improvement. Further, the lower operating voltage capability that is achieved without loss of performance is also a major advance since reduction of the operating voltage is generally important for compatibility with other circuit portions on the same chip that are also being shrunk.

FIGS. 6-15 illustrate schematically, in cross-sectional view, method stages 80-89 in accordance with still further embodiments of the invention for fabricating cascode amplifiers of the type illustrated in FIG. 4-5, adapted to be interconnected according to circuit 20 of FIG. 1 to form a cascode current mirror analogous to that of cascode current mirror 74. For convenience of description, method stages 80-89 are described for an N-channel device, but this is not intended to be limiting. The more general terms "first conductivity type" and "second opposite conductivity type" may be used in place of the "P" or "N" type descriptions or labels herein, where it is understood that the terms "first conductivity type" can refer to either P or N type doping and the term "second, opposite, conductivity type" therefore refers to the corresponding N or P (i.e., the opposite) type doping. For example, if a first region is identified as being of a first conductivity type, it can be either P or N type, and a second opposite conductivity type region would then be N or P type, respectively. Structures 800-890 result from manufacturing stages 80-89 respectively. Well known details of the various manufacturing stages are omitted. For example and not intended to be limiting, in some manufacturing stages, the mask(s) needed to define various regions of the devices for etching and/or doping are mentioned but not shown in the figures and only the results or such etching and/or doping steps using such masks are illustrated. Persons of skill in the art of manufacturing semiconductor devices will understand how to provide such masks based on the results shown. While manufacturing stages 80-89 of FIGS. 6-15 illustrate formation of cascode amplifier 60 of FIG. 4, it will be understood by those of skill in the art that companion cascode amplifier 60' needed to form cascode current mirror 74 is desirably being formed at the same time. In general, only cascode amplifier 60 is illustrated in stages 80-89 but it should be understood that these steps apply equally to companion cascode amplifier 60'. Thus, mention of companion (primed) regions is intended to refer to those regions of cascode amplifier 60' that correspond to similarly identified (unprimed) regions in cascode amplifier 60.

Figure 6:
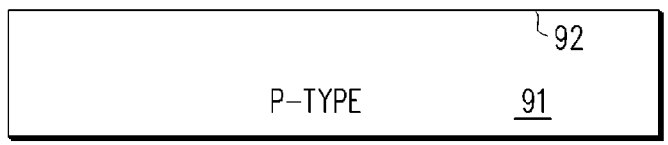
FIGS. 6-15 illustrate schematically, in cross-sectional view, method stages in accordance with still further embodiments of the invention for fabricating cascode amplifiers of the type illustrated in FIGS. 4-5, adapted to be interconnected according to the circuit of FIG. 1 to form a cascode current mirror.

Referring now to manufacturing stage 80 of FIG. 6, P-type substrate 91, equivalent to substrate 61, having upper surface 92 is provided. P-type substrate 91 may be a single crystal or polycrystalline material and may be a monolithic substrate or a layered substrate or merely a portion of such a substrate. For example and not intended to be limiting, "substrate" 91 may be a P-type well or region formed in a substrate containing other semiconductor or insulating regions. Accordingly, the term "substrate" is intended to include these and other variations. Substrate 91 should have a dopant concentration usefully in the range of about $10^{15}$ to $10^{18}$ cm$^{-3}$, more conveniently about $10^{16}$ to $10^{18}$ cm$^{-3}$, and preferably about $5 \times 10^{16}$ to $5 \times 10^{16}$ cm$^{-3}$. Structure 800 results.

Figure 7:
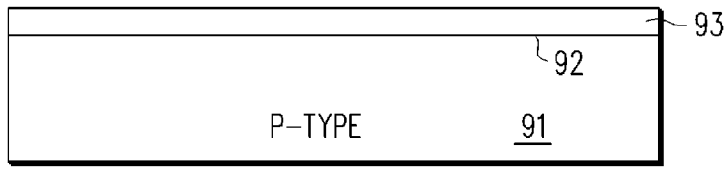

In manufacturing stage 81 of FIG. 7, relatively thick dielectric layer 93 is grown or otherwise formed on surface 92 of substrate 91. As will be subsequently explained, layer 93 forms the principal part of "thick" gate dielectric 68 underlying gate 66 of cascode amplifier 60 of FIGS. 4-5. Structure 810 results.

Figure 8:
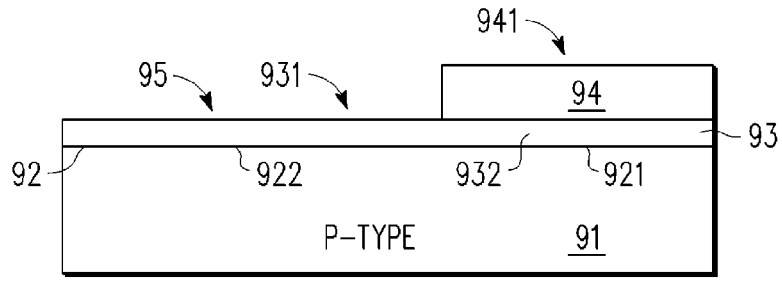

Referring now to manufacturing stage 82 of FIG. 8, mask 94 is applied in location 941 above portion 921 of surface 92 and opening 95 provided above portion 922 of surface 92. Portion 931 of dielectric layer 93 is thereby exposed in opening 95. Structure 820 results.

Figure 9:
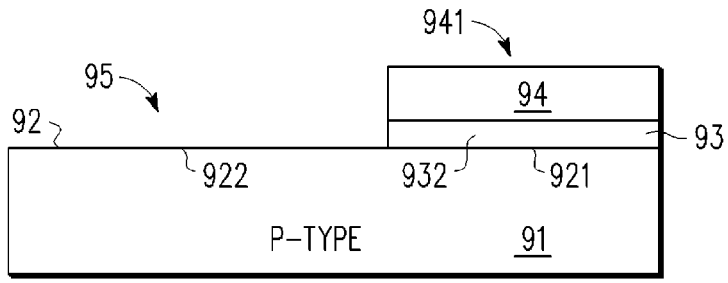

Referring now to manufacturing stage 83 of FIG. 9, portion 931 of dielectric layer 93 is etched away through opening 95 in mask 94, to remove portion 931 from portion 922 of surface 92 of substrate 91. Structure 830 results.

Figure 10:
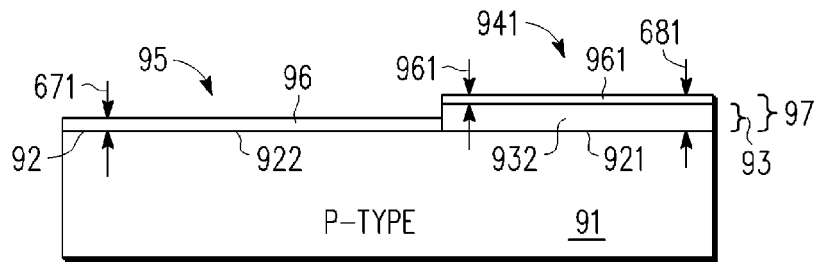

In manufacturing stage 84 of FIG. 10, relatively "thin" dielectric layer 96 is grown or otherwise formed to thickness 671 on exposed region 922 of surface 92 of substrate 91. A portion of layer 96 will subsequently form gate dielectric 67 of thickness 671 underlying gate 65 of transistor T1$_{new}$, T3$_{new}$ of device 60 of FIGS. 4-5. At the same time that layer 96 is being grown or formed on portion 922 of surface 92, portion 932 of "thick" dielectric layer 93 may increase in thickness by amount 961, so that "thick" dielectric portion 932 now has total thickness 97 corresponding to thickness 681 of dielectric region 68 underlying gate 66 of transistor T2$_{new}$, T4$_{new}$ of FIG. 4. Structure 840 results. According to a further embodiment, structure 840 of FIG. 10 may be obtained by initially forming thin dielectric layer 96 of thickness 671 on surface 92 of substrate 91, then protecting the part of layer 96 above portion 922 of surface 92 with an oxidation resistant mask and then further oxidizing to increase the thickness of region 932 above portion 921 of surface 92 to desired thickness 681. According to a still further embodiment, one or both of layers 96 and 932 may be formed by deposition, using masks to define thick region 68 and thin region 67. Either approach is useful.

Figure 11:
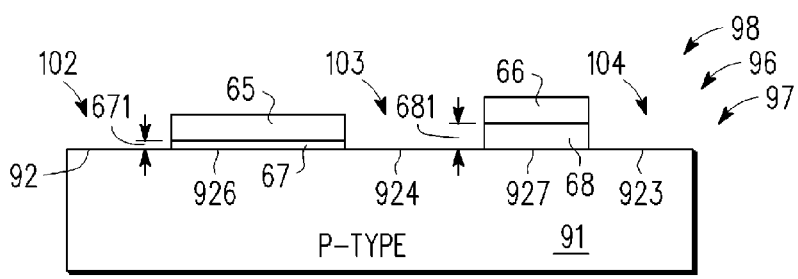

Referring now to manufacturing stage 85 of FIG. 11, structure 840 of FIG. 10 is covered by a blanket layer of conductive material suitable for forming gates 65, 66, 65', 66' of transistors T1$_{new}$, T2$_{new}$, T3$_{new}$, T4$_{new}$ of FIGS. 4-5. This layer of conductive material is covered with a suitable masking material, (e.g., photoresist or a hard mask or a combination thereof, not shown) having openings 102, 103 and 104. Corresponding openings are provided over the portion of substrate 91 on which companion cascode amplifier 60' is being formed. The conductive material and underlying dielectric is then etched though openings 102, 103 and 104 so as to define gates 65, 65' and underlying "thin" gate dielectric 67, 67' and gates 66, 66' and underlying "thick" gate dielectric 68, 68' on surface portions 926 and 927, respectively, of surface 92 of substrate 91. Portions 923, 924, 925 of surface 92 are exposed or optionally covered with a thin screen oxide in anticipation of subsequent doping steps. Structure 850 results.

Figure 12:
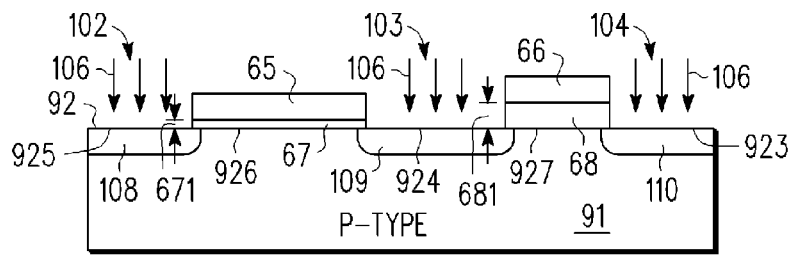

Referring now to manufacturing stage 86 of FIG. 12, N-type dopant 106 is introduced into substrate 91 through openings 102, 103, 104 to form N-type region 108 under opening 102, region 109 under opening 103 and region 110 under opening 104. Regions 108, 109, 110 should have a dopant concentration usefully in the range of about $10^{17}$ to $10^{19}$ cm$^{-3}$, more conveniently about $5 \times 10^{17}$ to $8 \times 10^{18}$ cm$^{-3}$, and preferably about $10^{18}$ to $5 \times 10^{18}$ cm$^{3}$. Ion implantation is the preferred doping means, but other doping methods may also be employed. Structure 860 results.

Figure 13:
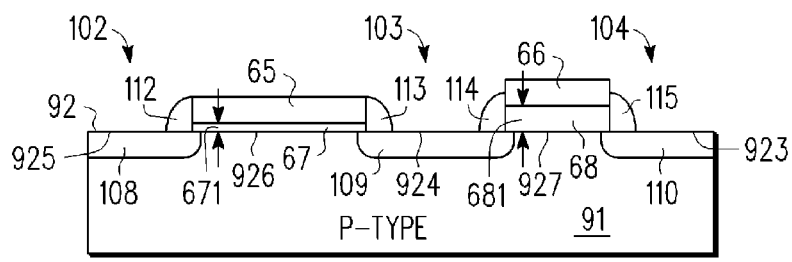

Referring now to manufacturing stage 87 of FIG. 13, structure 860 of FIG. 12 is covered by a blanket dielectric layer (not shown) and then anisotropically etched to form side-wall spacers 112, 113, 112', 113' at the lateral edges of gates 65, 65' and side-wall spacers 114, 115, 114', 115' at the lateral edges of gate 66, 66'. The purpose of sidewall spacers 112-115, 112'-115' is, among other things, to allow contacts (see FIG. 15) to be subsequently applied to source and drain without shorting to the gate edges. Means and methods for forming side-wall spacers are well known in the art. Structure 870 results.

Figure 14:
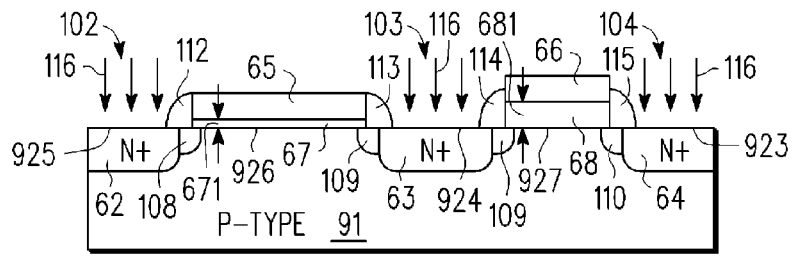

Referring now to manufacturing stage 88 of FIG. 14, structure 870 of FIG. 13 is further doped as shown by arrows 116 through openings 102, 103, 104 to provide N+ source and drain regions 62, 63, 64 in portions 925, 924, 923 of surface 92 of substrate 91. Ion implantation is preferred but other doping means may also be used. Structure 880 results. N+ regions 62, 63, 64 are shown as being deeper than N-doped regions 108, 109, 110 but this is merely for convenience of illustration and not intended to be limiting. They may have the same depth or be shallower or deeper. Either arrangement is useful.

Figure 15:
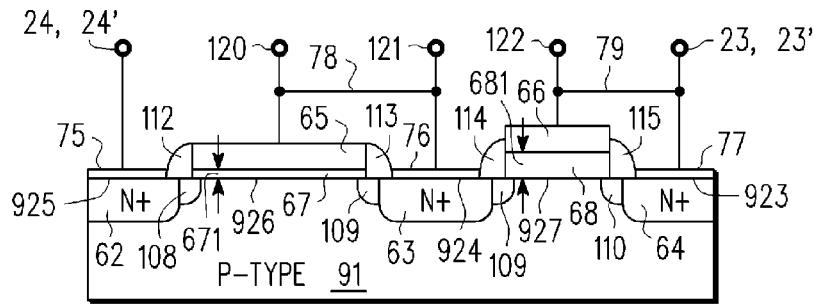

Referring now to manufacturing stage 89 of FIG. 15, ohmic contacts 75, 76 and 77 are provided on N+ regions 62, 63, 64 respectively. Silicides are preferred but not essential. Electrodes 24, 24' and 23, 23' may also be coupled to contacts 75 and 77 respectively, and contacts and 120, 121, 122 to gate 65, contact 76, and gate 66, respectively. As illustrated in FIG. 5, gate 65 and D/S region contact 76 are desirably tied together by connection 78 and gate 66 and drain region contact 77 are desirably tied together by connection 79, and further coupled as indicated in FIG. 5 to implement cascode current mirror circuit 20 of FIG. 1. Persons of skill in the art will also understand that while cascode amplifier 60 has interconnections 78, 79, such interconnections are not present in cascode amplifier 60', which has gates 65', 66' coupled to corresponding gates 65, 66 of cascode amplifier 60 as indicated in FIGS. 1 and 5. Structure 890 results from manufacturing stage 89 of FIG. 15.

A feature of this invention is to utilize the advantages of thinner gate MOSFETs. The first advantage of thinner gate MOSFETs is that they have lower threshold voltage Vt, which provides more headroom for a given supply voltage Vsupp, thereby increasing the gate overdrive. This makes it possible to increase the L to W ratio of the lower or bottom transistors of the current mirror. This in turn results in much lower current mismatch and makes possible a larger area shrink in the mirror. The second advantage is that thinner gate MOSFETs have lower overdrive for a given reference current, which again provides more headroom. The third advantage is that in general, thinner gate MOSFETs have lower current mismatch. Thus, the embodiments of the present disclosure are able to aggressively shrink the footprint area of a cascode current mirror.

However, merely thinning the gate oxide of the lower or bottom transistors of the cascode mirror is not, by itself, ordinarily feasible because such thinner gate oxides are more susceptible to electrical stress and the safe operation voltage for such thinner gate oxide MOSFETs is often less than the supply voltage Vsupp. By using thick gate oxide MOSFETs in the upper or top part of the cascode, the thin gate oxides of the lower or bottom transistors can be protected. In addition to eliminating the matching error due to the finite output impedance of the bottom MOSFETs, using thick gate oxide MOSFETs in the top of the cascode protects the thin gate bottom MOSFETs from overstressing. Standing alone, the thick gate oxide MOSFETs normally have poor matching performance, but inside the cascode they have little impact on the overall matching performance because the matching is dominated by the bottom thin gate oxide MOSFETs. Thus, the advantages of the invention are realized, among other things, by combining thinner gate oxide bottom transistors with thicker gate oxide top transistors and, preferably, also using unequal channel length to width ratios in the top and bottom transistors. As used herein, the word "oxide" is intended to include any form or composition of dielectric insulator.

According to a first embodiment, there is provided a cascode current mirror device, comprising, first and second series coupled MOS transistors adapted to form a reference current path of the current mirror device, wherein the first and second transistors have first and second gates overlying first and second gate dielectrics of first and second thicknesses, respectively, and the first and second transistors have first and second channel lengths and channel widths, respectively, and each transistor has a source and a drain and the source of the first transistor forms a first node, the drain of the first transistor is coupled to the source of the second transistor at a second node and the drain of the second transistor forms a third node, and wherein the current mirror device is adapted to have a reference current flow between the first and third nodes, and third and fourth series coupled MOS transistors adapted to form a mirror current path of the current mirror device, wherein the third and fourth transistors have third and fourth gates overlying third and fourth gate dielectrics of third and fourth thicknesses, respectively, and the third and fourth transistors have third and fourth channel lengths and channel widths, respectively, and each transistor has a source and a drain, and the source of the third transistor forms a fourth node, the drain of the third transistor is coupled to the source of the fourth transistor and the drain of the fourth transistor forms a fifth node, and the first and third gates are coupled together and to the second node and the second and fourth gates are coupled together and to the third node, and wherein the mirror current devices is adapted to have a mirror current flow between the fourth and fifth nodes, and wherein gate dielectric thicknesses of the first and third transistors are smaller than gate dielectric thicknesses of the second and fourth transistors, and wherein channel lengths of the first and third transistors are larger than channel lengths of the second and fourth transistors. According to a further embodiment, the first or third transistors have a ratio $RB_{new}$ of channel length to channel width in a range of about $1.5 \leq RB_{new} \leq 20$. According to a still further embodiment, the first or third transistors have a ratio $RB_{new}$ of channel length to channel width in a range of about $2 \leq RB_{new} \leq 10$. According to a yet further embodiment, the first or third transistors have a ratio $RB_{new}$ of channel length to channel width in a range of about $2 \leq RB_{new} \leq 4$. According to a still yet further embodiment, the first gate dielectric thickness of the first transistor is in a range of about 10 to 90 percent of the second gate dielectric thickness of the second transistor. According to a yet still further embodiment, the first gate dielectric thickness of the first transistor is in a range of about 20 to 50 percent of the second gate dielectric thickness of the second transistor. According to an additional embodiment, the first gate dielectric thickness of the first transistor is in a range of about 30 to 40 percent of the second gate dielectric thickness of the second transistor. According to a still additional embodiment, the second or fourth transistors have a ratio $RT_{new}$ of channel length to channel width in a range of about $0.2 \leq RT_{new} \leq 1$. According to a yet additional embodiment, the second or fourth transistors have a ratio $RT_{new}$ of channel length to channel width in a range of about $0.4 \leq RT_{new} \leq 1$.

According to a second embodiment, there is provided a method for forming a cascode current mirror using MOS transistors, comprising, providing a semiconductor substrate of a first conductivity type, and forming a first dielectric layer on a first portion of the semiconductor substrate, and forming a second dielectric layer on a second, different, portion of the semiconductor substrate and thinner than the first dielectric layer and forming a conductor over the first and second dielectric layers, and forming from the conductor, first and third spaced apart gates on the second dielectric layer over the second portion of the semiconductor substrate and second and fourth spaced apart gates on the first dielectric layer over the first portion of the semiconductor substrate, and doping multiple spaced apart regions of the substrate with a dopant of a second, opposite conductivity type, thereby forming source and drain regions in the substrate, wherein a first source regions is adjacent a first lateral side of the first gate, a second source region is adjacent a second lateral side of the second gate, a third source region is adjacent a third lateral side of the third gate, a fourth source region is adjacent a fourth lateral side of the fourth gate, and a first drain regions is adjacent a fifth lateral side of the first gate, a second drain region is adjacent a sixth lateral side of the second gate, a third drain region is adjacent a seventh lateral side of the third gate, a fourth drain region is adjacent an eighth lateral side of the fourth gate and the first drain region is coupled to the second source region and the third drain region is coupled to the fourth source region, and electrically coupling the first and third gates to each other and to the first drain region and electrically coupling the second and fourth gates to each other and to the second drain region. According to a further embodiment, the first or third gate is adapted to provide a channel length $LchB_{new}$ and channel width $WB_{new}$ having a ratio $RB_{new}=LChB_{new}/WB_{new}$ in the range of about $1.5 \leq RB_{new} \leq 20$. According to a still further embodiment, the ratio $RB_{new}$ is in the range of about $2 \leq RB_{new} \leq 10$. According to a yet further embodiment, the ratio $RB_{new}$ is in the range of about $2 \leq RB_{new} \leq 4$. According to a still yet further embodiment, the first dielectric layer has a first thickness and the second dielectric layer has a second thickness, and the second thickness is in the range of about 10 to 90 percent of first thickness. According to a yet still further embodiment, the first dielectric layer has a first thickness and the second dielectric layer has a second thickness, and the second thickness is in the range of about 20 to 50 percent of first thickness. According to an additional embodiment, the first dielectric layer has a first thickness and the second dielectric layer has a second thickness, and the second thickness is in the range of about 30 to 40 percent of first thickness.

According to a third embodiment, there is provided a cascode current mirror, comprising, first and second series coupled MOSFETs, each MOSFET having source, drain, gate and gate dielectric, wherein the drain of the first MOSFET is coupled to the source of the second MOSFET and the first and second series coupled MOSFETS are adapted to provide a reference current path between a source of the first MOSFET and a drain of the second MOSFET, and third and fourth series coupled MOSFETs, each MOSFET having source, drain, gate and gate dielectric, wherein the drain of the third MOSFET is coupled to the source of the fourth MOSFET and the third and fourth series coupled MOSFETS are adapted to provide a mirror current path between a source of the third MOSFET and a drain of the fourth MOSFET, and wherein gates of the first and third MOSFETs are coupled together and to the drain of the first MOSFET and gates of the second and fourth MOSFETs are coupled together and to the drain of the second MOSFET, and wherein the gate dielectrics of the first and third MOSFETS are thinner than the gate dielectrics of the second and fourth MOSFETS. According to an additional embodiment, the first and third MOSFETs are adapted to have conductive channels of length $LChB_{new}$ and width $WB_{new}$ having a ratio $RB_{new}=LchB_{new}/WB_{new}$ such that $1.5 \leq RB_{new} \leq 20$. According to a still additional embodiment, $2 \leq RB_{new} \leq 10$. According to a yet additional embodiment, the second and fourth MOSFETs are adapted to have conductive channels of length $LChT_{new}$ and width $WT_{new}$ having a ratio $RT_{new}=LchT_{new}/WT_{new}$ such that $0.2 \leq RT_{new} \leq 1$.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a cascode current mirror using MOS transistors, comprising:
    providing a semiconductor substrate of a first conductivity type;
    forming a first dielectric layer on a first portion of the semiconductor substrate;
    forming a second dielectric layer on a second, different, portion of the semiconductor substrate and thinner than the first dielectric layer;
    forming a conductor over the first and second dielectric layers;
    forming from the conductor, first and third spaced apart gates on the second dielectric layer over the second portion of the semiconductor substrate and second and fourth spaced apart gates on the first dielectric layer over the first portion of the semiconductor substrate;
    doping multiple spaced apart regions of the substrate with a dopant of a second, opposite conductivity type, thereby forming source and drain regions in the substrate, wherein a first source regions is adjacent a first lateral side of the first gate, a second source region is adjacent a second lateral side of the second gate, a third source region is adjacent a third lateral side of the third gate, a fourth source region is adjacent a fourth lateral side of the fourth gate, and a first drain regions is adjacent a fifth lateral side of the first gate, a second drain region is adjacent a sixth lateral side of the second gate, a third drain region is adjacent a seventh lateral side of the third gate, a fourth drain region is adjacent an eighth lateral side of the fourth gate and the first drain region is coupled to the second source region and the third drain region is coupled to the fourth source region; and
    electrically coupling the first and third gates to each other and to the first drain region and electrically coupling the second and fourth gates to each other and to the second drain region.

2. The method of claim 1, wherein the first or third gate is adapted to provide a channel length $LchB_{new}$ and channel width $WB_{new}$ having a ratio $RB_{new}=LchB_{new}/WB_{new}$ in the range of about $1.5 \leq RB_{new} \leq 20$.

3. The method of claim 2, wherein the ratio $RB_{new}$ is in the range of about $2 \leq RB_{new} \leq 10$.

4. The method of claim 3, wherein the ratio $RB_{new}$ is in the range of about $2 \leq RB_{new} \leq 4$.

5. The method of claim 1, wherein the first dielectric layer has a first thickness and the second dielectric layer has a second thickness, and the second thickness is in the range of about 10 to 90 percent of the first thickness.

6. The method of claim 5, wherein the first dielectric layer has a first thickness and the second dielectric layer has a second thickness, and the second thickness is in the range of about 20 to 50 percent of first thickness.

7. The method of claim 6, wherein the first dielectric layer has a first thickness the second dielectric layer has a second thickness, and the second thickness is in the range of about 30 to 40 percent of first thickness.

8. A method for forming a cascode current mirror, the method comprising:
    forming first, second, third, and fourth MOSFETs, each MOSFET having source, drain, gate and gate dielectric;
    coupling the drain of the first MOSFET to the source of the second MOSFET to form first and second series coupled MOSFETs, wherein the first and second series coupled MOSFETS are adapted to provide a reference current path between a source of the first MOSFET and a drain of the second MOSFET;
    coupling the drain of the third MOSFET to the source of the fourth MOSFET to form third and fourth series coupled MOSFETs, wherein the third and fourth series coupled MOSFETs are adapted to provide a mirror current path between a source of the third MOSFET and a drain of the fourth MOSFET, and wherein the gate dielectrics of the first and third MOSFETS are thinner than the gate dielectrics of the second and fourth MOSFETS;
    coupling gates of the first and third MOSFETs together and to the drain of the first MOSFET; and
    coupling gates of the second and fourth MOSFETs together and to the drain of the second MOSFET.

9. The method of claim 8, wherein the first and third MOSFETs are adapted to have conductive channels of length $LchB_{new}$ and width $WB_{new}$ having a ratio $RB_{new} LchB_{new}/WB_{new}$ such that $1.5 \leq RB_{new} \leq 20$.

10. The method of claim 9, wherein $2 \leq RB_{new} \leq 10$.

11. The method of claim 8, wherein the second and fourth MOSFETs are adapted to have conductive channels of length $LchT_{new}$ and width $WT_{new}$ having a ratio $RT_{new}=LchT_{new}/WT_{new}$ such that $0.2 \leq RT_{new} \leq 1$.

12. A method for forming a cascode current mirror, the method comprising:

forming first and second series coupled MOS transistors adapted to form a reference current path of the current mirror device, wherein the first and second transistors have first and second gates overlying first and second gate dielectrics of first and second thicknesses, respectively, and the first and second transistors have first and second channel lengths and channel widths, respectively, and each transistor has a source and a drain and the source of the first transistor forms a first node, the drain of the first transistor is coupled to the source of the second transistor at a second node and the drain of the second transistor forms a third node, and wherein the current mirror device is adapted to have a reference current flow between the first and third nodes; and forming third and fourth series coupled MOS transistors adapted to form a mirror current path of the current mirror device, wherein the third and fourth transistors have third and fourth gates overlying third and fourth gate dielectrics of third and fourth thicknesses, respectively, and the third and fourth transistors have third and fourth channel lengths and channel widths, respectively, and each transistor has a source and a drain, and the source of the third transistor forms a fourth node, the drain of the third transistor is coupled to the source of the fourth transistor and the drain of the fourth transistor forms a fifth node, and the first and third gates are coupled together and to the second node and the second and fourth gates are coupled together and to the third node, and wherein the mirror current devices is adapted to have a mirror current flow between the fourth and fifth nodes, wherein gate dielectric thicknesses of the first and third transistors are smaller than gate dielectric thicknesses of the second and fourth transistors, and wherein channel lengths of the first and third transistors are larger than channel lengths of the second and fourth transistors.

13. The method of claim 12, wherein the first or third transistors have a ratio $RB_{new}$ of channel length to channel width in a range of about $1.5 \leq RB_{new} \leq 20$.

14. The method of claim 13, wherein the first or third transistors have a ratio $RB_{new}$ of channel length to channel width in a range of about $2 \leq RB_{new} \leq 10$.

15. The method of claim 14, wherein the first or third transistors have a ratio $RB_{new}$ of channel length to channel width in a range of about $2 \leq RB_{new} \leq 4$.

16. The method of claim 12, wherein the first gate dielectric thickness of the first transistor is in a range of about 10 to 90 percent of the second gate dielectric thickness of the second transistor.

17. The method of claim 16, wherein the first gate dielectric thickness of the first transistor is in a range of about 20 to 50 percent of the second gate dielectric thickness of the second transistor.

18. The method of claim 17, wherein the first gate dielectric thickness of the first transistor is in a range of about 30 to 40 percent of the second gate dielectric thickness of the second transistor.

19. The method of claim 12, wherein the second or fourth transistors have a ratio $RT_{new}$ of channel length to channel width in a range of about $0.2 \leq RT_{new} \leq 1$.

20. The method of claim 19, wherein the second or fourth transistors have a ratio $RT_{new}$ of channel length to channel width in a range of about $0.4 \leq RT_{new} \leq 1$.

* * * * *